US012695430B2

(12) United States Patent
Peng et al.

(10) Patent No.: US 12,695,430 B2
(45) Date of Patent: Jul. 28, 2026

(54) CIRCUIT AND METHOD FOR PROTECTING POWER AMPLIFIER

(71) Applicant: SMARTER MICROELECTRONICS (GUANG ZHOU) CO., LTD., Guangzhou (CN)

(72) Inventors: Yangyang Peng, Guangzhou (CN); Yang Hou, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 449 days.

(21) Appl. No.: 18/466,743

(22) Filed: Sep. 13, 2023

(65) Prior Publication Data

US 2023/0421113 A1     Dec. 28, 2023

Related U.S. Application Data

(63) Continuation of application No. PCT/CN2022/134270, filed on Nov. 25, 2022.

(30) Foreign Application Priority Data

Nov. 25, 2021     (CN) .......................... 202111412220.1

(51) Int. Cl.
  *H03F 1/52*          (2006.01)
  *H03F 3/21*          (2006.01)
(52) U.S. Cl.
  CPC ................. *H03F 1/52* (2013.01); *H03F 3/21* (2013.01); *H03F 2200/171* (2013.01); *H03F 2200/426* (2013.01)

(58) Field of Classification Search
  CPC ........ H03F 1/52; H03F 3/21; H03F 2200/171; H03F 2200/426; H03F 3/19; H03F 3/211; H03F 1/523; H03F 3/245; H03F 3/72; H03F 3/30; H03F 2200/441; H03F 2200/444; H03F 2200/447; H03G 3/3042
  USPC ................................................. 330/207 P, 298
  See application file for complete search history.

(56) References Cited

U.S. PATENT DOCUMENTS 6,657,499 B2 * 12/2003 Lin ......................... H03F 1/301
                                                              330/296
10,038,405 B2 * 7/2018 Poulin ...................... H04B 1/40
2020/0186090 A1 * 6/2020 Choi ...................... H03F 1/0205

* cited by examiner

*Primary Examiner* — Khanh V Nguyen
(74) *Attorney, Agent, or Firm* — Syncoda LLC; Feng Ma

(57)                    ABSTRACT

A circuit for protecting an amplifier includes a detection circuit, a controller and a bypass impedance adjustment circuit. The detection circuit is configured to detect an operation electrical signal of a power amplifier and generate a trigger electrical signal based on the operation electrical signal correspondingly. A first output end of the controller is connected to a base or a gate or a bias circuit of the power amplifier, and a second output end of the controller is connected to a control input end of the bypass impedance adjustment circuit. The bypass impedance adjustment circuit is connected in parallel with the power amplifier. The controller is configured to generate a first control signal and a second control signal based on the trigger electrical signal, and the first control signal is configured to control a bias current or bias voltage of the power amplifier.

17 Claims, 13 Drawing Sheets

Circuit 600 for protecting an amplifier

First to N-th voltage detection circuits 601

Controller 602

Bypass impedance adjustment circuit 603

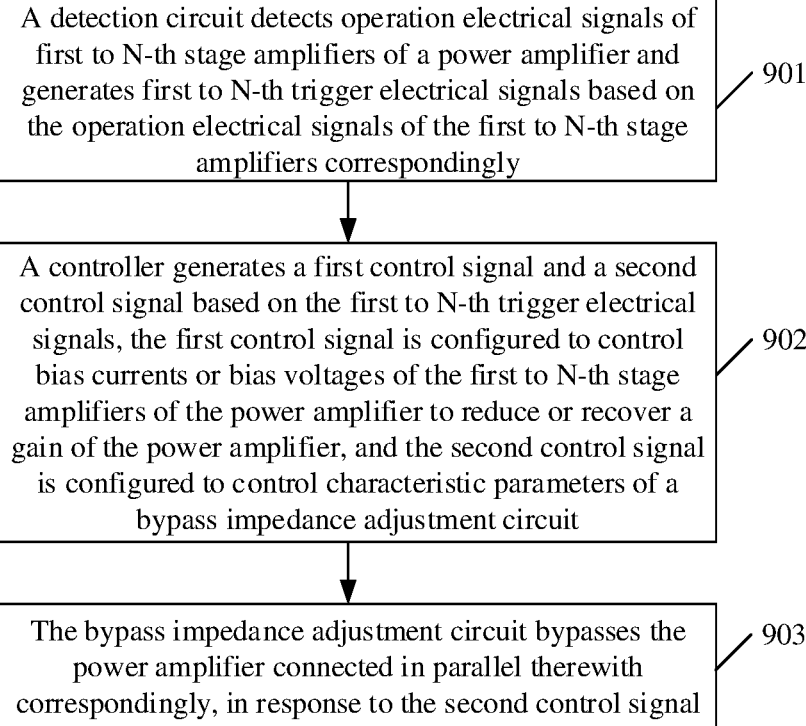

A detection circuit detects operation electrical signals of first to N-th stage amplifiers of a power amplifier and generates first to N-th trigger electrical signals based on the operation electrical signals of the first to N-th stage amplifiers correspondingly 901

A controller generates a first control signal and a second control signal based on the first to N-th trigger electrical signals, the first control signal is configured to control bias currents or bias voltages of the first to N-th stage amplifiers of the power amplifier to reduce or recover a gain of the power amplifier, and the second control signal is configured to control characteristic parameters of a bypass impedance adjustment circuit 902

The bypass impedance adjustment circuit bypasses the power amplifier connected in parallel therewith correspondingly, in response to the second control signal 903

FIG. 9

CIRCUIT AND METHOD FOR PROTECTING POWER AMPLIFIER

CROSS-REFERENCE TO RELATED APPLICATIONS

This is a continuation of International Application No. PCT/CN2022/134270 mailed on Nov. 25, 2022, which claims priority to Chinese Patent Application No. 202111412220.1 filed on Nov. 25, 2021. The disclosures of the above-referenced applications are hereby incorporated by reference in their entirety.

BACKGROUND

In some implementations, an overcurrent protection circuit and overvoltage protection circuit for a power amplifier may reduce a gain of the power amplifier or turn off the power amplifier by reducing or closing a bias current of the power amplifier after protection is enabled. When voltage protection or current protection is removed, a process of establishing bias of the power amplifier is uncertain.

SUMMARY

The disclosure relates to, but is not limited to, a circuit and method for protecting an amplifier.

In view of some implementations in which when a signal with large input power is input, the power amplifier may be burnt out due to the large input power at the moment of recovering establishment of a path, it is desirable for the disclosure to provide a circuit and method for protecting an amplifier.

According to a first aspect, the disclosure provides a circuit for protecting an amplifier, including a detection circuit, a controller and a bypass impedance adjustment circuit.

The detection circuit is provided with an input end connected to a power amplifier and an output end connected to an input end of the controller, and is configured to detect an operation electrical signal of the power amplifier and generate a trigger electrical signal based on the operation electrical signal correspondingly.

A first output end of the controller is connected to a base or a gate or a bias circuit of the power amplifier, and a second output end of the controller is connected to a control input end of the bypass impedance adjustment circuit.

The bypass impedance adjustment circuit is connected in parallel with the power amplifier.

The controller is configured to generate a first control signal and a second control signal based on the trigger electrical signal, the first control signal is configured to control a bias current or bias voltage of the power amplifier to reduce or recover a gain of the power amplifier, and the second control signal is configured to control characteristic parameters of the bypass impedance adjustment circuit.

The bypass impedance adjustment circuit is configured to bypass the power amplifier connected in parallel therewith correspondingly, in response to the second control signal.

According to a second aspect, the disclosure provides a method for protecting an amplifier, applied to the circuit for protecting an amplifier as described above, the method includes the following operations.

A detection circuit detects an operation electrical signal of the power amplifier, and generates a trigger electrical signal based on the operation electrical signal correspondingly.

A controller generates a first control signal and a second control signal based on the trigger electrical signal, the first control signal is configured to control a bias current or bias voltage of the power amplifier to reduce or recover a gain of the power amplifier, and the second control signal is configured to control characteristic parameters of a bypass impedance adjustment circuit.

The bypass impedance adjustment circuit bypasses the power amplifier connected in parallel therewith correspondingly, in response to the second control signal.

In the disclosure, since the circuit for protecting the amplifier includes a bypass impedance adjustment circuit bridged between an input end of an i-th stage amplifier and an output end of a j-th stage amplifier of the power amplifier, in case that voltage protection or current protection is removed, the characteristic parameters of the bypass impedance adjustment circuit may be decreased in a process of establishing bias of the power amplifier, to reduce power passing through i-th to j-th stage amplifiers connected in parallel with the bypass impedance adjustment circuit, such that most of input power enters a later stage amplifier through the bypass impedance adjustment circuit. Therefore, the gain of the power amplifier is reduced, while an input power signal entering the power amplifier matches the operation current or voltage of the power amplifier, and a problem where the power amplifier is burnt out due to a large input power at the moment of recovering establishment of a path is reduced.

It should be understood that the above general descriptions and the following detailed descriptions are only exemplary and explanatory, rather than limiting the disclosure.

BRIEF DESCRIPTION OF THE DRAWINGS

Drawings here are incorporated into the description and form a part of the description. These drawings show embodiments in accordance with the disclosure and are intended to explain technical solutions of the disclosure, together with the description.

FIG. 9 is a schematic flowchart of implementation of a method for protecting an amplifier according to an embodiment of the disclosure.

DETAILED DESCRIPTION

The disclosure will be further described in detail below with reference to the drawings and embodiments. It should be understood that embodiments provided here are only intended to explain the disclosure, rather than limiting the disclosure. Furthermore, the embodiments provided below are part of embodiments implementing the disclosure, while all embodiments implementing the disclosure are not provided. Technical solutions recited in the embodiments of the disclosure may be implemented in any combination without conflict.

It should be noted that in the embodiments of the disclosure, terms "including", "include" or any other variants thereof are intended to encompass non-exclusive inclusion, to allow a method or device including a series of elements to include not only elements which are recorded clearly, but also other elements which are not listed clearly or elements inherent to implementation of the method or device. Without further limitation, an element defined by a phrase "including a . . . " does not preclude presence of additional related elements in a method or device including the element (for example, operations in the method or units in the device, for example, the unit may be part of the circuit, part of the processor, part of the program or software, or the like).

A term "and/or" here is only an association relationship describing associated objects and represents that there may be three kinds of relationships. For example, U and/or W may represent that there are three situations: presence of U alone, presence of U and W simultaneously, and presence of W alone. Furthermore, a term "at least one" here represents any one of multiple items or any combination of at least two of multiple items. For example, inclusion of at least one of U, W or V may represent inclusion of any one or more elements selected from a set formed of U, W and V.

Power amplifier (PA) has a function of amplifying power of a signal, has a high operation power, requires a large voltage and current, and is easy to be burnt out when it is operated improperly. In some implementations, in order to enhance reliability of PA, overvoltage and overcurrent protection circuits may be added in circuit design. In case of overvoltage and overcurrent, a bias current of PA is reduced or even cut off to achieve the purpose of protecting PA.

Figure 1:
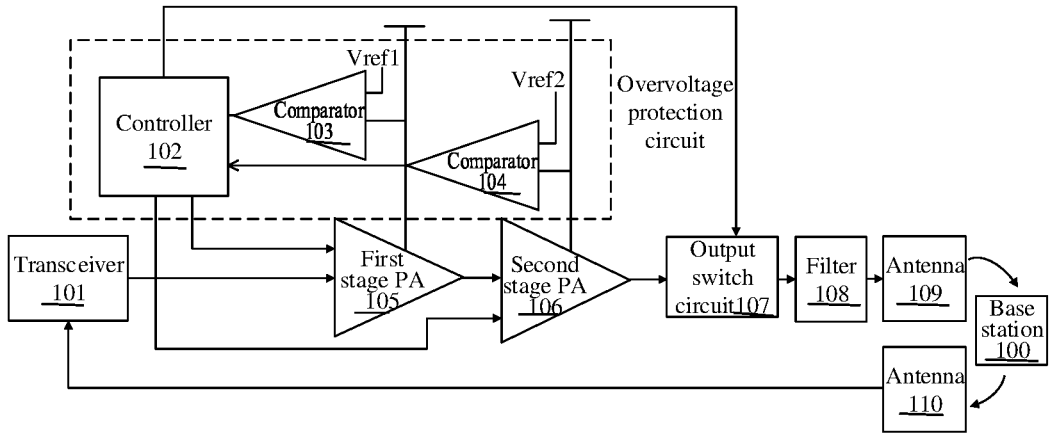
FIG. 1 is a schematic diagram of system compositional structures of an overvoltage protection circuit including a power amplifier in some implementations.

FIG. 1 is a schematic diagram of system compositional structures of an overvoltage protection circuit including a power amplifier in some implementations. As shown in FIG. 1, the system includes a base station 100, a transceiver 101, a controller 102, a comparator 103, a comparator 104, a first stage PA 105, a second stage PA 106, an output switch circuit 107, a filter 108, an antenna 109 and an antenna 110.

Here, a first input end of the comparator 103 is connected to a reference voltage Vref1, a second input end of the comparator 103 is connected to a collector of a power transistor of the first stage PA 105, and an output end of the comparator 103 is connected to a first input end of the controller 102. A first input end of the comparator 104 is connected to a reference voltage Vref2, a second input end of the comparator 104 is connected to a collector of a power transistor of the second stage PA 106, and an output end of the comparator 104 is connected to a second input end of the controller 102. A first output end of the controller 102 is connected to a bias current control input end of the first stage PA 105, a second output end of the controller 102 is connected to a bias current control input end of the second stage PA 106, and a third output end of the controller 102 is connected to a control input end of the output switch circuit 107. The antenna 110 is connected to an input end of the transceiver 101, an output end of the transceiver 101 is connected to a power input end of the first stage PA 105, an output end of the first stage PA 105 is connected to a power input end of the second stage PA 106, an output end of the second stage PA 106 is connected to a power input end of the output switch circuit 107, an output end of the output switch circuit 107 is connected to an input end of the filter 108, and an output end of the filter 108 is connected to the antenna 109. Here, no line is connected between the base station 100 and the antennas 109 and 110, however, the base station 100 may receive a power signal fed back by the antenna 109 and send control commands to the antenna 110.

Operation process includes the following operations. The overvoltage protection circuit compares a power supply voltage source of the power transistor of the first stage PA 105 with the reference voltage Vref1 to obtain a first comparison signal, and compares a power supply voltage source of the power transistor of the second stage PA 106 with the reference voltage Vref2 to obtain a second comparison signal. When an excessive voltage occurs on PA, the overvoltage protection circuit provides the first comparison signal and the second comparison signal to the controller 102, and the controller 102 generates a first current control signal and a second current control signal configured to control bias currents of the first stage PA 105 and the second stage PA 106 respectively, and an output switch control signal configured to turn off the output switch circuit 107, based on the first comparison signal and the second comparison signal. The first stage PA 105 is offset to a lower direct current (DC) operation point, or is directly turned off, in response to the first current control signal. The second stage PA 106 is offset to a lower DC operation point, or is directly turned off, in response to the second current control signal. The output switch circuit 107 turns off its path with the filter 108, in response to the output switch control signal, thus achieving an effect of protecting PA.

Figure 2:
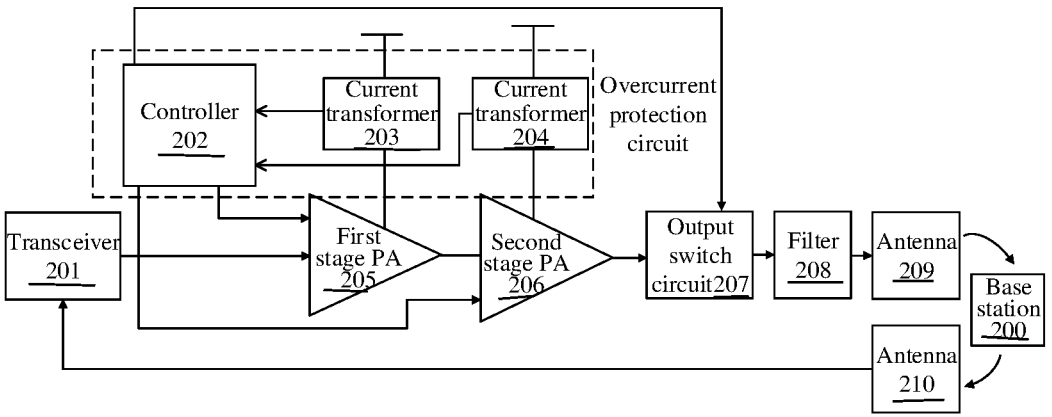
FIG. 2 is a schematic diagram of system compositional structures of an overcurrent protection circuit including a power amplifier in some implementations.

FIG. 2 is a schematic diagram of system compositional structures of an overcurrent protection circuit including a power amplifier in some implementations. As shown in FIG. 2, the system includes a base station 200, a transceiver 201, a controller 202, a current transformer 203, a current transformer 204, a first stage PA 205, a second stage PA 206, an output switch circuit 207, a filter 208, an antenna 209 and an antenna 210.

Here, the current transformer 203 is arranged on a circuit connecting a collector of a power transistor of the first stage PA 205 to a power supply voltage source, and the current transformer 204 is arranged on a circuit connecting a collector of a power transistor of the second stage PA 206 to a power supply voltage source. Output ends of the current transformer 203 and the current transformer 204 are connected to a first input end and a second input end of the controller 202 respectively. A first output end of the controller 202 is connected to a bias current control input end of the first stage PA 205, a second output end of the controller 202 is connected to a bias current control input end of the second stage PA 206, and a third output end of the controller 202 is connected to a control input end of the output switch circuit 207. The antenna 210 is connected to an input end of the transceiver 201, an output end of the transceiver 201 is connected to a power input end of the first stage PA 205, an output end of the first stage PA 205 is connected to a power input end of the second stage PA 206, an output end of the second stage PA 206 is connected to a power input end of the output switch circuit 207, an output end of the output switch circuit 207 is connected to an input end of the filter 208, and an output end of the filter 208 is connected to the antenna 209. Here, no line is connected between the base station 200 and the antennas 209 and 210, however, the base station 200 may receive a power signal fed back by the antenna 209 and send control commands to the antenna 210.

Operation process includes the following operations. The current transformer 203 detects an operation current of the first stage PA 205, and the current transformer 204 detects an operation current of the second stage PA 206. When an excessive current occurs on PA, the overcurrent protection circuit provides the operation current of the first stage PA 205 and the operation current of the second stage PA 206 to the controller 202, and the controller 202 generates a first current control signal and a second current control signal configured to control bias currents of the first stage PA 205 and the second stage PA 206 respectively, and an output switch control signal configured to turn off the output switch circuit 207, based on the operation current of the first stage PA 205 and the operation current of the second stage PA 206. The first stage PA 205 is offset to a lower DC operation point, or is directly turned off, in response to the first current control signal. The second stage PA 206 is offset to a lower DC operation point, or is directly turned off, in response to the second current control signal. The output switch circuit 207 turns off its path with the filter 208, in response to the output switch control signal, thus achieving an effect of protecting PA.

Furthermore, it may be seen from FIG. 1 and FIG. 2 that after voltage protection or current protection is enabled, a bias current of PA may be pulled down or cut off, and in this case, an overall gain of PA becomes low. When the gain of PA becomes low, output power of PA may become low. At this time, in order to ensure that the output power of PA remains at an original target value, under closed-loop control of power of the system, the base station of the system may continuously push up input power of PA to make the output power of PA close to the original target value as much as possible. Since the gain of PA is relatively low at this time, the input power may be pushed to a relatively high power. When the voltage protection or current protection is removed at this time, PA may immediately return to a normal operation state, that is, PA may have a large bias current and a large gain. It may be understood that there may be uncertain states in a process of establishing an entire radio frequency (RF) path to a steady state: a process of establishing bias of PA is uncertain; the output switch circuit connected to the filter (load) on the RF path may not be fully opened, and load of PA is not a certain impedance around 50 ohms. At this time, when a large input signal is input, PA may be broken due to a large input power at the moment of recovering establishment of the RF path.

Figure 3:
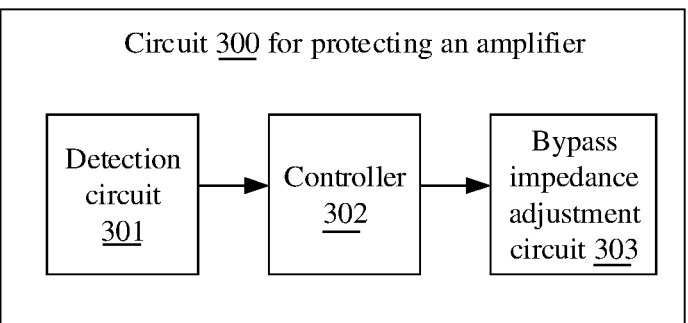
FIG. 3 is a schematic diagram of compositional structures of a circuit for protecting an amplifier according to an embodiment of the disclosure.

In view of the above technical problems, an embodiment of the disclosure provides a circuit for protecting an amplifier. As shown in FIG. 3, the circuit 300 for protecting an amplifier includes a detection circuit 301, a controller 302 and a bypass impedance adjustment circuit 303.

The detection circuit 301 is provided with an input end connected to a power amplifier and an output end connected to an input end of the controller 302, and is configured to detect an operation electrical signal of the power amplifier and generate a trigger electrical signal based on the operation electrical signal correspondingly.

A first output end of the controller 302 is connected to a base or a gate or a bias circuit of the power amplifier, and a second output end of the controller 302 is connected to a control input end of the bypass impedance adjustment circuit 303.

The bypass impedance adjustment circuit is connected in parallel with the power amplifier.

The controller 302 is configured to generate a first control signal and a second control signal based on the trigger electrical signal, the first control signal is configured to control a bias current or bias voltage of the power amplifier to reduce or recover a gain of the power amplifier, and the second control signal is configured to control characteristic parameters of the bypass impedance adjustment circuit 303.

The bypass impedance adjustment circuit 303 is configured to bypass the power amplifier connected in parallel therewith correspondingly, in response to the second control signal.

Here, the input end of the detection circuit 301 may be connected to a feed end such as a collector or source of the power amplifier, or to other positions where an operation voltage or operation current of the power amplifier may be tested.

In some possible implementations, the power amplifier includes multiple stage amplifiers, such as first to N-th stage amplifiers; in other words, the power amplifier is a multi-stage amplifier. Here, each stage amplifier may be connected to the detection circuit, or only part of the amplifiers may be connected to the detection circuit. For example, a final stage amplifier of the multi-stage amplifier is connected to the detection circuit, and other stage amplifiers are not connected to the detection circuit. For another example, last two stage amplifiers of the multi-stage amplifier are connected to the detection circuit.

In case that the power amplifier includes first to N-th stage amplifiers, the detection circuit 301 is configured to detect operation electrical signals of the first to N-th stage amplifiers of the power amplifier and generate first to N-th trigger electrical signals based on the operation electrical signals of the first to N-th stage amplifiers correspondingly.

An m-th port in the first output end of the controller 302 is connected to a base or a gate or a bias circuit of an m-th stage amplifier correspondingly, the second output end of the controller 302 is connected to the control input end of the bypass impedance adjustment circuit 303, and m represents any positive integer from 1 to N.

The bypass impedance adjustment circuit 303 is bridged between an input end of an i-th stage amplifier and an output end of a j-th stage amplifier, and j is less than or equal to N and greater than or equal to i.

The controller 302 is configured to generate the first control signal and the second control signal based on the first to N-th trigger electrical signals, the first control signal is configured to control bias currents or bias voltages of the first to N-th stage amplifiers of the power amplifier to reduce or recover a gain of the power amplifier, and the second control signal is configured to control characteristic parameters of the bypass impedance adjustment circuit 303.

The bypass impedance adjustment circuit 303 is configured to reduce or recover the gain of the power amplifier, in response to the second control signal.

In some possible implementations, an output end of the bypass impedance adjustment circuit is connected to an input end of a final stage amplifier of the power amplifier.

In some possible implementations, the bypass impedance adjustment circuit is further configured to attenuate an input signal. The bypass impedance adjustment circuit may include a bypass network (or referred to a bypass adjustable attenuation network).

In some possible implementations, the second control signal increases input power of the power amplifier, after a preset time elapses from the first control signal recovering the gain of the power amplifier. Here, the preset time may be a time required for the power amplifier to be stable.

In some possible implementations, there is an impedance matching circuit between the transceiver and the power amplifier, an output end of the impedance matching circuit is connected to an input end of a power input end of the power amplifier.

In some implementations, the detection circuit 301 may include at least one of a voltage detection circuit or a current detection circuit. In case that the detection circuit 301 includes the voltage detection circuit and the current detection circuit simultaneously, and the input end of the detection circuit 301 is connected to the feed end (such as collector) of the power amplifier, the detection circuit 301 may obtain voltage signals and current signals of the first to N-th stage amplifiers of the power amplifier simultaneously, and take the voltage signals and current signals as operation currents and operation voltages (operation electrical signals) of the first to N-th stage amplifiers respectively. That is, the detection circuit 301 includes at least first to N-th voltage detection circuits and first to N-th current detection circuits, here, an i-th voltage detection circuit is configured to detect an operation voltage of the i-th stage amplifier, an i-th current detection circuit is configured to detect the operation current of the first stage amplifier, and i is any positive integer from 1 to N. When the power amplifier includes multiple stage amplifiers, the multiple stage amplifiers may be connected to different detection circuits, for example, the final stage amplifier is connected to the voltage detection circuit, and an intermediate stage amplifier is connected to the current detection circuit.

In a possible implementation, the detection circuit 301 further includes first to N-th voltage comparison circuits, an i-th voltage comparison circuit is configured to compare the operation voltage of the i-th stage amplifier with a power supply voltage source of a power transistor of the i-th stage amplifier to obtain a trigger voltage signal of the i-th stage amplifier.

In a possible implementation, the first to N-th trigger electrical signals may include first to N-th trigger voltage signals and first to N-th trigger current signals, and the first to N-th trigger electrical signals represent voltage signals and/or current signals configured to trigger protection circuits of the first to N-th amplifiers of the power amplifiers. Of course, the first to N-th trigger voltage signals may be voltage signals or logic signals obtained after performing a comparison operation between each stage amplifier of the first to N-th stage amplifiers and voltage at a corresponding feeding end. Here, currents of the first to N-th stage amplifiers may be directly taken as trigger current signals of corresponding stage amplifiers.

In a possible implementation, the controller 302 may be at least one of an Application Specific Integrated Circuit (ASIC), a Digital Signal Processor (DSP), a Digital Signal Processing Device (DSPD), a Programmable Logic Device (PLD), a Field Programmable Gate Array (FPGA), a Central Processing Unit (CPU), a controller, a microcontroller, or a microprocessor. The controller 302 may generate the first control signal configured to control bias currents or bias voltages of the first to N-th stage amplifiers of the power amplifier and the second control signal configured to control the characteristic parameters of the bypass impedance adjustment circuit 303, based on the first to N-th trigger electrical signals.

In some implementations, the bypass impedance adjustment circuit 303 is bridged between the input end of the i-th stage amplifier and the output end of the j-th stage amplifier, and j is less than or equal to N and greater than or equal to i. In case that the power amplifier includes first to third stage amplifiers, the bypass impedance adjustment circuit 303 may be bridged between an input end of the first stage amplifier and an output end of the first stage amplifier, and at this time, a power signal flowing through the second stage power amplifier may be decreased or increased by controlling the characteristic parameters of the bypass impedance adjustment circuit 303. Or, in case that the power amplifier includes first to third stage amplifiers, the bypass impedance adjustment circuit 303 may be bridged between an input end of the first stage amplifier and an output end of the second stage amplifier, and at this time, characteristic parameters of the first stage amplifier and the second stage amplifier may be controlled, or, power signals flowing through the first stage amplifier and the second stage amplifier may be decreased or increased, by the characteristic parameters of the bypass impedance adjustment circuit 303.

In some implementations, the bypass impedance adjustment circuit 303 may include a bypass switch circuit, and the characteristic parameters of the bypass impedance adjustment circuit 303 may include an impedance of the bypass switch circuit, for example, when the switch is turned on or off.

In some other implementations, the bypass impedance adjustment circuit 303 may include a bypass network, and the characteristic parameters of the bypass impedance adjustment circuit 303 include at least one of an impedance or insertion loss of the bypass network.

In an implementation, the bypass impedance adjustment circuit 303 reduces or recovers the gain of the power amplifier in response to the second control signal, it may be that the bypass impedance adjustment circuit 303 reduces or recovers gains of i-th to j-th stage amplifiers connected in parallel with the bypass impedance adjustment circuit 303, in response to the second control signal.

It may be understood that in case that first to N-th electrical trigger signals are obtained by the controller 302 from the detection circuit 301 and indicate occurrence of overvoltage and/or overcurrent of at least one stage amplifier of the power amplifier, the controller 302 generates a control signal configured to reduce or cut off a bias current or bias voltage of the at least one stage amplifier, to reduce a gain of the at least one stage amplifier; and generates a control signal configured to decrease the characteristic parameters (impedance or insertion loss) of the bypass impedance adjustment circuit 303, such that among power signals transmitted by the transceiver, power of a power signal passing through the bypass impedance adjustment circuit 303 is increased, and power of power signals entering the i-th to j-th stage amplifiers connected in parallel with the bypass impedance adjustment circuit 303 is decreased. Therefore, the gain of the power amplifier is reduced, while an input power signal input to the power amplifier matches the operation current or voltage of the power amplifier, thus implementing protection of the power amplifier.

In some implementations, in case that the electrical trigger signal indicates occurrence of overvoltage and/or overcurrent, the controller 302 is further configured to generate a control signal configured to cut off the bias current or bias voltage, or turn off an output switch circuit of the power amplifier, to turn off a load filter of the power amplifier.

In some other implementations, in case that the electrical trigger signal indicates that overvoltage and overcurrent states are removed, the controller 302 is further configured to generate a control signal configured to turn on the bias circuit or output switch circuit of the power amplifier, such that the power amplifier may operate normally.

In the embodiments of the disclosure, since the circuit for protecting the amplifier includes the bypass impedance adjustment circuit bridged between the input end of the i-th stage amplifier and the output end of the j-th stage amplifier of the power amplifier, in case that voltage protection or current protection is removed, the characteristic parameters of the bypass impedance adjustment circuit may be decreased in a process of establishing bias of the power amplifier, to reduce power passing through i-th to j-th stage amplifiers connected in parallel with the bypass impedance adjustment circuit, such that most of input power enters a later stage amplifier through the bypass impedance adjustment circuit. Therefore, the gain of the power amplifier is reduced, while an input power signal entering the power amplifier matches the operation current or voltage of the power amplifier, and a problem where the power amplifier is burnt out due to a large input power at the moment of recovering establishment of a path is reduced.

Figure 4:
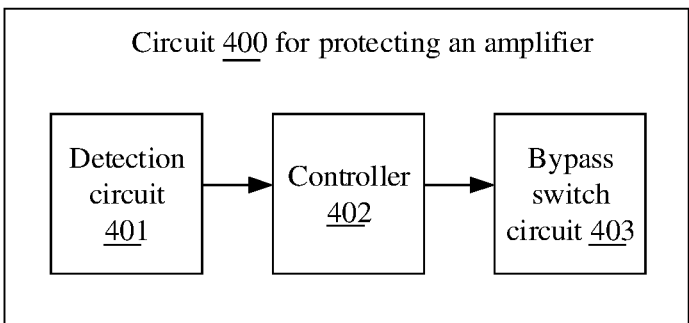
FIG. 4 is a schematic diagram of compositional structures of another circuit for protecting an amplifier according to an embodiment of the disclosure.

FIG. 4 is a schematic diagram of compositional structures of another circuit for protecting an amplifier according to an embodiment of the disclosure. As shown in FIG. 4, the circuit 400 for protecting an amplifier includes a detection circuit 401, a controller 402 and a bypass switch circuit 403.

The detection circuit 401 is provided with an input end connected to a power amplifier and an output end connected to an input end of the controller 402, and is configured to detect operation electrical signals of first to N-th stage amplifiers of the power amplifier and generate first to N-th trigger electrical signals based on the operation electrical signals of the first to N-th stage amplifiers correspondingly.

An m-th port in a first output end of the controller 402 is connected to a base or a gate or a bias circuit of an m-th stage amplifier correspondingly, a second output end of the controller 402 is connected to a control input end of the bypass switch circuit 403, and m represents any positive integer from 1 to N.

The bypass switch circuit 403 is connected in parallel with the power amplifier.

The controller 402 is configured to generate a first control signal and a second control signal based on the first to N-th trigger electrical signals, the first control signal is configured to control bias currents or bias voltages of the first to N-th stage amplifiers of the power amplifier to reduce or recover a gain of the power amplifier, and the second control signal is configured to adjust an impedance of the bypass switch circuit 403.

The bypass switch circuit 403 is configured to adjust the impedance itself in response to the second control signal, to perform short-circuit on or connect to the power amplifier connected in parallel therewith correspondingly, and reduce or recover the gain of the power amplifier.

In some possible implementations, the second control signal may be a control signal which adjusts the impedance of the bypass switch circuit 403 such that the bypass switch circuit 403 is in two states, i.e., turn-on and turn-off states.

In some possible implementations, the bypass switch circuit 403 is bridged between the input end of the i-th stage amplifier and the output end of the j-th stage amplifier, and j is less than or equal to N and greater than or equal to i. That is, the bypass switch circuit is connected in parallel with the i-th to j-th stage amplifiers. The bypass switch circuit 403 is configured to adjust the impedance itself in response to the second control signal, to perform short-circuit on or connect to the i-th to j-th stage amplifiers connected in parallel therewith correspondingly, and reduce or recover the gain of the power amplifier.

In the embodiments of the disclosure, since the circuit for protecting the amplifier includes the bypass switch circuit bridged between the input end of the i-th stage amplifier and the output end of the j-th stage amplifier of the power amplifier, in case that voltage protection or current protection is removed, the impedance of the bypass switch circuit may be decreased in a process of establishing bias of the power amplifier, to reduce power passing through i-th to j-th stage amplifiers connected in parallel with the bypass switch circuit, such that most of input power enters a later stage amplifier through the bypass switch circuit. Therefore, the gain of the power amplifier is reduced, while an input power signal entering the power amplifier matches the operation current or voltage of the power amplifier, and a problem where the power amplifier is burnt out due to a large input power at the moment of recovering establishment of a path is reduced.

Figure 5:
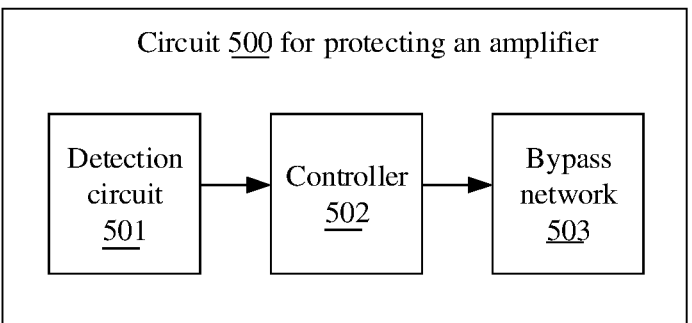
FIG. 5 is a schematic diagram of compositional structures of still another circuit for protecting an amplifier according to an embodiment of the disclosure.

FIG. 5 is a schematic diagram of compositional structures of still another circuit for protecting an amplifier according to an embodiment of the disclosure. As shown in FIG. 5, the circuit 500 for protecting an amplifier includes a detection circuit 501, a controller 502 and a bypass network 503.

The detection circuit 501 is provided with an input end connected to a power amplifier and an output end connected to an input end of the controller 502, and is configured to detect operation electrical signals of first to N-th stage amplifiers of the power amplifier and generate first to N-th trigger electrical signals based on the operation electrical signals of the first to N-th stage amplifiers correspondingly.

An m-th port in a first output end of the controller 502 is connected to a base or a gate or a bias circuit of an m-th stage amplifier correspondingly, a second output end of the controller 502 is connected to a control input end of the bypass network 503, and m represents any positive integer from 1 to N.

The bypass network is connected in parallel with the power amplifier.

The controller 502 is configured to generate a first control signal and a second control signal based on the first to N-th trigger electrical signals, the first control signal is configured to control bias currents or bias voltages of the first to N-th stage amplifiers of the power amplifier to reduce or recover a gain of the power amplifier, and the second control signal is configured to adjust at least an impedance or insertion loss of the bypass network 503.

The bypass network 503 is configured to adjust at least the impedance or the insertion loss itself in response to the second control signal, to reduce or recover the gain of the power amplifier.

In some possible implementations, the bypass network 503 is bridged between an input end of an i-th stage amplifier and an output end of a j-th stage amplifier, and j is less than or equal to N and greater than or equal to i.

In some possible implementations, the bypass network is configured to bypass the power amplifier connected in parallel therewith correspondingly, in response to the second control signal.

In some possible implementations, the bypass network is further configured to attenuate an input signal. The bypass network may be referred to a bypass adjustable attenuation network.

In the embodiments of the disclosure, since the circuit for protecting the amplifier includes the bypass network bridged between the input end of the i-th stage amplifier and the output end of the j-th stage amplifier of the power amplifier, in case that voltage protection or current protection is removed, the impedance or insertion loss of the bypass network may be decreased in a process of establishing bias of the power amplifier, to reduce power passing through i-th to j-th stage amplifiers connected in parallel with the bypass network, such that most of input power enters a later stage amplifier through the bypass network. Therefore, the gain of the power amplifier is reduced, while an input power signal entering the power amplifier matches the operation current or voltage of the power amplifier, and a problem where the power amplifier is burnt out due to a large input power at the moment of recovering establishment of a path is reduced.

Figure 6:
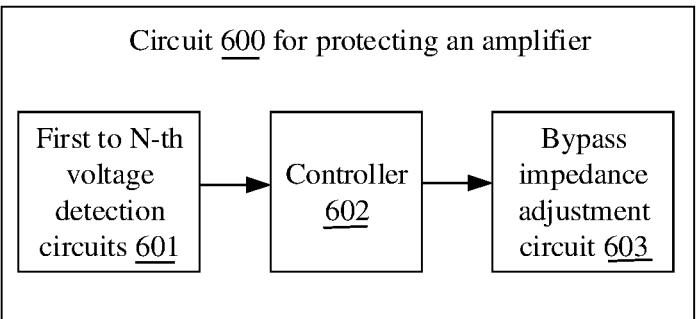
FIG. 6 is a schematic diagram of compositional structures of yet another circuit for protecting an amplifier according to an embodiment of the disclosure.

FIG. 6 is a schematic diagram of compositional structures of yet another circuit for protecting an amplifier according to an embodiment of the disclosure. As shown in FIG. 6, the circuit 600 for protecting an amplifier includes first to N-th voltage detection circuits 601, a controller 602 and a bypass impedance adjustment circuit 603.

A k-th voltage detection circuit is provided with a first input end configured to obtain a reference voltage, a second input end connected to a feed end of a k-th stage amplifier and an output end connected to a k-th port in a first input end of the controller, and k represents any positive integer from 1 to N.

The k-th voltage detection circuit is configured to detect an operation voltage signal of the k-th stage amplifier and generate a k-th trigger voltage signal based on the operation voltage signal of the k-th stage amplifier.

An m-th port in a first output end of the controller 602 is connected to a base or a gate or a bias circuit of an m-th stage amplifier correspondingly, a second output end of the controller 602 is connected to a control input end of the bypass impedance adjustment circuit 603, and m represents any positive integer from 1 to N.

The bypass impedance adjustment circuit 603 is bridged between an input end of an i-th stage amplifier and an output end of a j-th stage amplifier, and j is less than or equal to N and greater than or equal to i.

The controller 602 is configured to generate a first control signal and a second control signal based on the first to N-th trigger voltage signals, the first control signal is configured to control bias currents or bias voltages of first to N-th stage amplifiers of the power amplifier to reduce or recover a gain of the power amplifier, and the second control signal is configured to control characteristic parameters of the bypass impedance adjustment circuit 603.

The bypass impedance adjustment circuit 603 is configured to bypass the power amplifier connected in parallel therewith correspondingly, in response to the second control signal.

It may be understood that a voltage amplitude of a k-th reference voltage may be equal to an amplitude of a voltage connected to a power supply voltage source of a power transistor of the k-th stage amplifier, that is, the voltage amplitude of the k-th reference voltage may also be a voltage signal Vcc.

In some possible implementations, the k-th voltage detection circuit in the detection circuit may compare a detected actual voltage on the power supply voltage source of the power transistor of the k-th stage amplifier with a voltage of the k-th reference voltage, obtain a comparison result, and determine the comparison result as a trigger voltage signal of the k-th stage amplifier, i.e., the k-th trigger voltage signal.

Here, the detection circuit may provide the first to N-th trigger voltage signals to the controller 602, such that the controller 602 generates the first control signal and the second control signal. Here, the comparison result may be a logic signal (0 or 1) configured to indicate whether each stage amplifier of the first to N-th stage amplifiers is in an overvoltage state.

In some implementations, in case that the controller 602 determines that the k-th trigger voltage signal indicates occurrence of overvoltage protection of the N-th stage amplifier, the controller 602 generates a first control signal configured to control a bias current or bias voltage of the k-th stage amplifier to be reduced and a second control signal configured to decrease the characteristic parameters of the bypass impedance adjustment circuit 603, and in case that the controller 602 determines that the k-th trigger voltage signal indicates non-occurrence of overvoltage protection, the controller 602 generates a first control signal configured to increase or recover the bias current or bias voltage of the k-th stage amplifier and a second control signal configured to increase the characteristic parameters of the bypass impedance adjustment circuit 603.

In the embodiments of the disclosure, since the circuit for protecting the power amplifier includes the bypass impedance adjustment circuit bridged between the input end of the i-th stage amplifier and the output end of the j-th stage amplifier of the power amplifier, in case that removal of voltage protection is detected by the first to N-th voltage detection circuits, the characteristic parameters of the bypass impedance adjustment circuit may be decreased in a process of establishing bias of the power amplifier, to reduce power of i-th to j-th stage amplifiers connected in parallel with the bypass impedance adjustment circuit, such that most of input power enters a later stage amplifier through the bypass impedance adjustment circuit. Therefore, the gain of the power amplifier is reduced, while an input power signal entering the power amplifier matches the operation current or voltage of the power amplifier, and a problem where the power amplifier is burnt out due to a large input power at the moment of recovering establishment of a path is reduced.

Figure 7:
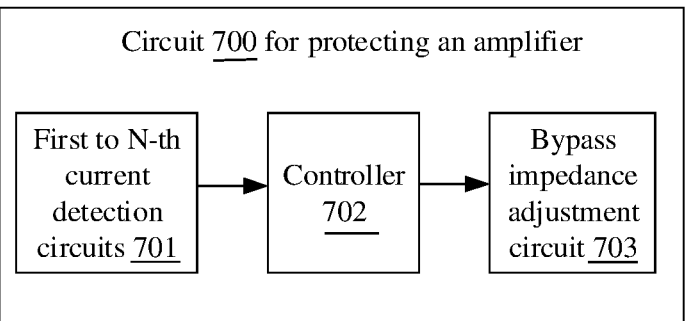
FIG. 7 is a schematic diagram of compositional structures of another one circuit for protecting an amplifier according to an embodiment of the disclosure.

FIG. 7 is a schematic diagram of compositional structures of another one circuit for protecting an amplifier according to an embodiment of the disclosure. As shown in FIG. 7, the circuit 700 for protecting an amplifier includes first to N-th current detection circuits 701, a controller 702 and a bypass impedance adjustment circuit 703.

A k-th current detection circuit is provided with an input end connected to a feed end of a k-th stage amplifier and a detection output end connected to a k-th port in a second input end of the controller, and k represents any positive integer from 1 to N.

The k-th current detection circuit is configured to detect an operation current signal of the k-th stage amplifier and generate a k-th trigger current signal based on the operation current signal of the k-th stage amplifier.

An m-th port in a first output end of the controller 702 is connected to a base or a gate or a bias circuit of an m-th stage amplifier correspondingly, a second output end of the controller 702 is connected to a control input end of the bypass impedance adjustment circuit 703, and m represents any positive integer from 1 to N.

The bypass impedance adjustment circuit 703 is bridged between an input end of an i-th stage amplifier and an output end of a j-th stage amplifier, and j is less than or equal to N and greater than or equal to i.

The controller 702 is configured to generate a first control signal and a second control signal based on the first to N-th trigger current signals, the first control signal is configured to control bias currents or bias voltages of first to N-th stage amplifiers of the power amplifier to reduce or recover a gain of the power amplifier, and the second control signal is configured to control characteristic parameters of the bypass impedance adjustment circuit 703.

The bypass impedance adjustment circuit 703 is configured to bypass the power amplifier connected in parallel therewith correspondingly, in response to the second control signal.

It may be understood that the first to N-th current detection circuits 701 may be first to N-th current sensitive resistors or first to N-th current transformers.

In an example, the operation current signal of the k-th stage amplifier may be a current signal Ic on a collector of the k-th stage amplifier.

In some implementations, the first control signal and the second control signal are generated based on the first to N-th trigger current signals, it may be that the controller determines whether overcurrent of each stage amplifier of the power amplifier occurs according to the first to N-th trigger current signals, and generates a control signal configured to decrease a bias current or voltage of an amplifier where overcurrent occurs, when it determines that overcurrent of any stage amplifier occurs, so as to reduce or recover a gain of the amplifier where overcurrent occurs, and decrease the characteristic parameters of the bypass impedance adjustment circuit 703, such that most of input power enters a later stage amplifier through the bypass impedance adjustment circuit 703. Therefore, the gain of the power amplifier is reduced, while an input power signal enters the power amplifier, to implement protection of the power amplifier.

In the embodiments of the disclosure, since the circuit for protecting the amplifier includes the bypass impedance adjustment circuit bridged between the input end of the i-th stage amplifier and the output end of the j-th stage amplifier of the power amplifier, in case that removal of current protection is detected by the first to N-th current detection circuits, the characteristic parameters of the bypass impedance adjustment circuit may be decreased in a process of establishing bias of the power amplifier, to reduce power of i-th to j-th stage amplifiers connected in parallel with the bypass impedance adjustment circuit, such that most of input power enters a later stage amplifier through the bypass impedance adjustment circuit. Therefore, the gain of the power amplifier is reduced, while an input power signal entering the power amplifier matches the operation current of the power amplifier, and a problem where the power amplifier is burnt out due to a large input power at the moment of recovering establishment of a path is reduced.

Figure 8:
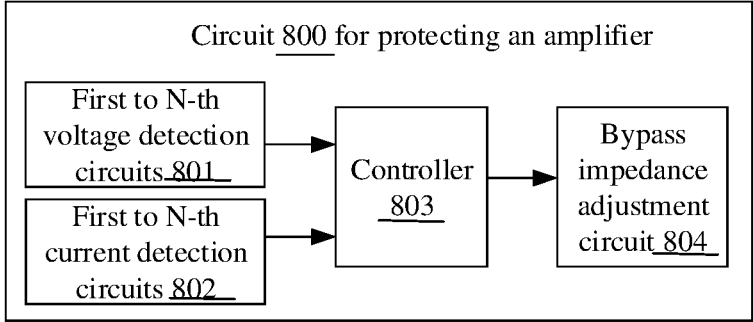
FIG. 8 is a schematic diagram of compositional structures of still another one circuit for protecting an amplifier according to an embodiment of the disclosure.

FIG. 8 is a schematic diagram of compositional structures of still another one circuit for protecting an amplifier according to an embodiment of the disclosure. As shown in FIG. 8, the circuit 800 for protecting an amplifier includes first to N-th voltage detection circuits 801, first to N-th current detection circuits 802, a controller 803 and a bypass impedance adjustment circuit 804.

A k-th voltage detection circuit is provided with a first input end configured to obtain a reference voltage, a second input end connected to a feed end of a k-th stage amplifier and an output end connected to a k-th port in a first input end of the controller, and k represents any positive integer from 1 to N.

The k-th voltage detection circuit is configured to detect an operation voltage signal of the k-th stage amplifier and generate a k-th trigger voltage signal based on the operation voltage signal of the k-th stage amplifier.

A k-th current detection circuit is provided with an input end connected to a feed end of the k-th stage amplifier and a detection output end connected to a k-th port in a second input end of the controller.

The k-th current detection circuit is configured to detect an operation current signal of the k-th stage amplifier and generate a k-th trigger current signal based on the operation current signal of the k-th stage amplifier.

An m-th port in a first output end of the controller 803 is connected to a base or a gate or a bias circuit of an m-th stage amplifier correspondingly, a second output end of the controller 803 is connected to a control input end of the bypass impedance adjustment circuit 804, and m represents any positive integer from 1 to N.

The bypass impedance adjustment circuit 804 is bridged between an input end of an i-th stage amplifier and an output end of a j-th stage amplifier, and j is less than or equal to N and greater than or equal to i.

The controller 803 is configured to generate a first control signal and a second control signal based on the first to N-th trigger voltage signals and the first to N-th trigger current signals, the first control signal is configured to control bias currents or bias voltages of first to N-th stage amplifiers of the power amplifier to reduce or recover a gain of the power amplifier, and the second control signal is configured to control characteristic parameters of the bypass impedance adjustment circuit 804.

The bypass impedance adjustment circuit 804 is configured to bypass the power amplifier connected in parallel therewith correspondingly, in response to the second control signal.

In the embodiments of the disclosure, since the circuit for protecting the amplifier includes the bypass impedance adjustment circuit bridged between the input end of the i-th stage amplifier and the output end of the j-th stage amplifier of the power amplifier, in case that removal of voltage protection and current protection is detected by the first to N-th voltage detection circuits and the first to N-th current detection circuits, the characteristic parameters of the bypass impedance adjustment circuit may be decreased in a process of establishing bias of the power amplifier, to reduce power of i-th to j-th stage amplifiers connected in parallel with the bypass impedance adjustment circuit, such that most of input power enters a later stage amplifier through the bypass impedance adjustment circuit. Therefore, the gain of the power amplifier is reduced, while an input power signal entering the power amplifier matches the operation current and voltage of the power amplifier, and a problem where the power amplifier is burnt out due to a large input power at the moment of recovering establishment of a path is reduced.

In some possible implementations, the power amplifier includes a first stage amplifier and a second stage amplifier, and the bypass impedance adjustment circuit 804 is bridged between an input end of the first stage amplifier and an output end of the first stage amplifier.

Based on the above embodiments, an embodiment of the disclosure provides a method for protecting an amplifier, including the following operations.

A detection circuit detects an operation electrical signal of the power amplifier, and generates a trigger electrical signal based on the operation electrical signal correspondingly.

A controller generates a first control signal and a second control signal based on the trigger electrical signal, the first control signal is configured to control a bias current or bias voltage of the power amplifier to reduce or recover a gain of the power amplifier, and the second control signal is configured to control characteristic parameters of a bypass impedance adjustment circuit.

The bypass impedance adjustment circuit bypasses the power amplifier connected in parallel therewith correspondingly, in response to the second control signal.

In some possible implementations, the bypass impedance adjustment circuit includes a bypass network configured to bypass the power amplifier connected in parallel therewith correspondingly, in response to the second control signal.

An embodiment of the disclosure provides a method for protecting an amplifier. As shown in FIG. 9, the method includes the following operations 901 to 903.

In operation 901, a detection circuit detects operation electrical signals of first to N-th stage amplifiers of a power amplifier and generates first to N-th trigger electrical signals based on the operation electrical signals of the first to N-th stage amplifiers correspondingly.

In operation 902, a controller generates a first control signal and a second control signal based on the first to N-th trigger electrical signals, the first control signal is configured to control bias currents or bias voltages of the first to N-th stage amplifiers of the power amplifier to reduce or recover a gain of the power amplifier, and the second control signal is configured to control characteristic parameters of a bypass impedance adjustment circuit.

In operation 903, the bypass impedance adjustment circuit reduces or recovers the gain of the power amplifier, in response to the second control signal.

In some embodiments, the bypass impedance adjustment circuit includes a bypass switch circuit, and the characteristic parameters of the bypass impedance adjustment circuit include an impedance of the bypass switch circuit. Or, the bypass impedance adjustment circuit includes a bypass network, and the characteristic parameters of the bypass impedance adjustment circuit include at least an impedance or insertion loss of the bypass network.

An embodiment of the disclosure further provides a method for protecting an amplifier, including the following operations S1001 to S1004.

In operation S1001, a detection circuit obtains operation voltage signals of first to N-th stage amplifiers, and generates first to N-th trigger voltage signals based on the operation voltage signals of the first to N-th stage amplifiers and corresponding reference voltages.

In operation S1002, a controller determines whether each stage amplifier of the first to N-th stage amplifiers is in an overvoltage state according to the first to N-th trigger voltage signals.

In operation 51003, a h-th sub-signal and a (N+1)-th sub-signal are generated in response to determining that a h-th stage amplifier of the first to N-th stage amplifiers is in the overvoltage state, h is a positive integer between 1 and N, the h-th sub-signal is configured to reduce or cut off a bias current or bias voltage of the h-th stage amplifier respectively, and the (N+1)-th sub-signal is configured to decrease characteristic parameters of a bypass impedance adjustment circuit.

In operation S1004, the bypass impedance adjustment circuit reduces a gain of the power amplifier in response to the (N+1)-th sub-signal, to implement protection of the power amplifier.

An embodiment of the disclosure further provides a method for protecting an amplifier, including the following operations S1101 to S1104.

In operation S1101, a detection circuit obtains operation voltage signals of first to N-th stage amplifiers, and generates first to N-th trigger voltage signals based on the operation voltage signals of the first to N-th stage amplifiers and corresponding reference voltages.

In operation S1102, a controller determines whether each stage amplifier of the first to N-th stage amplifiers is in a normal voltage state according to the first to N-th trigger voltage signals.

In operation S1103, (N+2)-th to (2N+1)-th sub-signals are generated in response to determining that each stage amplifier of the first to N-th stage amplifiers is in the normal voltage state, and a preset time is delayed to generate a (2N+2)-th sub-signal, the (N+2)-th to (2N+1)-th sub-signals are configured to recover bias currents or bias voltages of the first to N-th stage amplifiers, and the (2N+2)-th sub-signal is configured to increase characteristic parameters of a bypass impedance adjustment circuit.

It may be understood that the preset time is longer than a time required for the system to reach a steady state. For example, the preset time may be 10 microseconds.

In operation S1104, the bypass impedance adjustment circuit recovers a gain of the power amplifier in response to the (2N+2)-th sub-signal, to recover operation of the power amplifier.

An embodiment of the disclosure further provides a method for protecting an amplifier, including the following operations S1201 to S1204.

In operation S1201, a detection circuit obtains operation current signals of first to N-th stage amplifiers, and determines the operation current signals of the first to N-th stage amplifiers as first to N-th trigger current signals.

In operation S1202, a controller determines whether each stage amplifier of the first to N-th stage amplifiers is in an overcurrent state according to the first to N-th trigger current signals.

In operation S1203, a h-th sub-signal and a (N+1)-th sub-signal are generated in response to determining that a h-th stage amplifier of the first to N-th stage amplifiers is in the overcurrent state, h is a positive integer between 1 and N.

In operation S1204, a bypass impedance adjustment circuit reduces a gain of the power amplifier in response to the (N+1)-th sub-signal, to implement protection of the power amplifier.

An embodiment of the disclosure further provides a method for protecting an amplifier, including the following operations S1301 to S1304.

In operation S1301, a detection circuit obtains operation current signals of first to N-th stage amplifiers, and determines the operation current signals of the first to N-th stage amplifiers as first to N-th trigger current signals.

In operation S1302, a controller determines whether each stage amplifier of the first to N-th stage amplifiers is in a normal current state according to the first to N-th trigger current signals.

In operation S1303, (N+2)-th to (2N+1)-th sub-signals are generated in response to determining that each stage amplifier of the first to N-th stage amplifiers is in the normal current state, and a preset time is delayed to generate a (2N+2)-th sub-signal.

It may be understood that the preset time is longer than a time required for the system to reach a steady state. For example, the preset time may be 10 microseconds.

In operation S1304, a bypass impedance adjustment circuit recovers a gain of the power amplifier in response to the (2N+2)-th sub-signal, to recover operation of the power amplifier.

Figure 10:
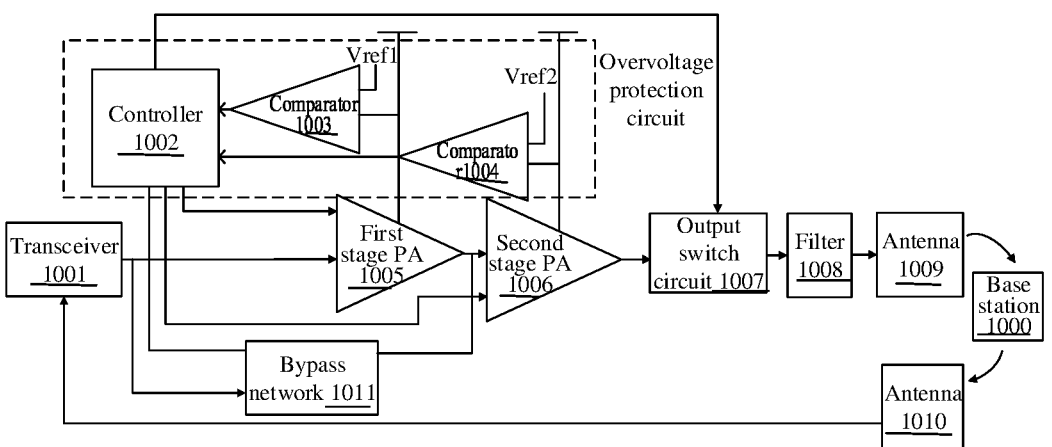
FIG. 10 is a schematic diagram of system compositional structures of an overvoltage protection circuit for a power amplifier according to an embodiment of the disclosure.

FIG. 10 is a schematic diagram of system compositional structures of an overvoltage protection circuit for a power amplifier according to an embodiment of the disclosure. As shown in FIG. 10, the system includes a base station 1000, a transceiver 1001, a controller 1002, a comparator 1003, a comparator 1004, a first stage PA 1005, a second stage PA 1006, an output switch circuit 1007, a filter 1008, an antenna 1009, an antenna 1010, and a bypass network 1011.

Here, a first input end of the comparator 1003 is connected to a reference voltage Vref1, a second input end of the comparator 1003 is connected to a collector of a power transistor of the first stage PA 1005, and an output end of the comparator 1003 is connected to a first input end of the controller 1002. A first input end of the comparator 1004 is connected to a reference voltage Vref2, a second input end of the comparator 1004 is connected to a collector of a power transistor of the second stage PA 1006, and an output end of the comparator 1004 is connected to a second input end of the controller 1002. A first output end of the controller 1002 is connected to a bias current control input end of the first stage PA 1005, a second output end of the controller 1002 is connected to a bias current control input end of the second stage PA 1006, a third output end of the controller 1002 is connected to a control input end of the output switch circuit 1007, and a fourth output end of the controller 1002 is connected to a control input end of the bypass network 1011. The antenna 1010 is connected to an input end of the transceiver 1001, an output end of the transceiver 1001 is connected to a power input end of the first stage PA 1005, an output end of the first stage PA 1005 is connected to a power input end of the second stage PA 1006, an output end of the second stage PA 1006 is connected to a power input end of the output switch circuit 1007, an output end of the output switch circuit 1007 is connected to an input end of the filter 1008, and an output end of the filter 1008 is connected to the antenna 1009. The bypass network 1011 is bridged between the power input end of the first stage PA 1005 and a power output end of the first stage PA 1005. Here, no line is connected between the base station 1000 and the antennas 1009 and 1010, however, the base station 1000 may receive a power signal fed back by the antenna 1009 and send control commands to the antenna 1010.

The comparator 1003 is configured to compare the reference voltage Vref1 with a power supply voltage source of the power transistor of the first stage PA 1005 to obtain a first comparison signal. The comparator 1004 is configured to compare the reference voltage Vref2 with a power supply voltage source of the power transistor of the second stage PA 1006 to obtain a second comparison signal. The controller 1002 is configured to generate a first current control signal, a second current control signal, a bypass network control signal and an output switch control signal based on the first comparison signal and the second comparison signal. The first current control signal is configured to control a bias current of the first stage PA 1005. The second current control signal is configured to control a bias current of the second stage PA 1006. The bypass network control signal is configured to increase or decrease characteristic parameters of the bypass network 1011. The output switch control signal is configured to control the output switch circuit 1007 to be turned on or off. The base station 1000 is configured to receive a feedback power signal sent by the antenna 1009 and send generated control commands to the antenna 1010. The antenna 1010 is configured to receive the control commands sent by the base station 1000 and transmit the control commands to the transceiver 1001. The transceiver 1001 is configured to provide input power with corresponding power to the first stage PA 1005, in response to the control commands. The bypass network 1011 is configured to increase or decrease the characteristic parameters itself, in response to the bypass network control signal, so as to decrease or increase a power signal input to the first stage PA 1005. The first stage PA 1005 is configured to perform a first power signal amplification on an input power signal, in response to the first current control signal, and input a power signal after the first amplification to the second stage PA 1006. The second stage PA 1006 is configured to perform a second amplification on the power signal after the first amplification, in response to the second current control signal, and input a power signal after the second amplification to the output switch circuit 1007. The output switch circuit 1007 is configured to turn on or off connection between the second stage PA 1006 and the filter 1008. The filter 1008 is configured to implement switching of different frequency bands (communication modes). The antenna 1009 is configured to feed a power signal output by the filter 1008 back to the base station 1000. The antenna 1010 is configured to receive the control commands sent by the base station 1000 and send the control commands to the transceiver 1001.

Operation process includes the following operations. The overvoltage protection circuit compares the power supply voltage source of the power transistor of the first stage PA 1005 with the reference voltage Vref1 to obtain the first comparison signal, and compares the power supply voltage source of the power transistor of the second stage PA 1006 with the reference voltage Vref2 to obtain the second comparison signal. When an excessive voltage occurs on PA, the overvoltage protection circuit provides the first comparison signal and the second comparison signal to the controller 1002, and the controller 1002 generates the first current control signal and the second current control signal configured to control bias currents of the first stage PA 1005 and the second stage PA 1006 respectively, the bypass network control signal configured to decrease the characteristic parameters of the bypass network 1011, and the output switch control signal configured to turn off the output switch circuit 1007, based on the first comparison signal and the second comparison signal. The first stage PA 1005 is offset to a lower DC operation point, or is directly turned off, in response to the first current control signal. The second stage PA 1006 is offset to a lower DC operation point, or is directly turned off, in response to the second current control signal. The bypass network 1011 decreases the characteristic parameters of the network, in response to the bypass network control signal, so as to increase an input power signal of the bypass network (decrease the input power signal of the first stage PA 1005) and decrease a gain of the power amplifier, thus achieving an effect of protecting PA.

Figure 11:
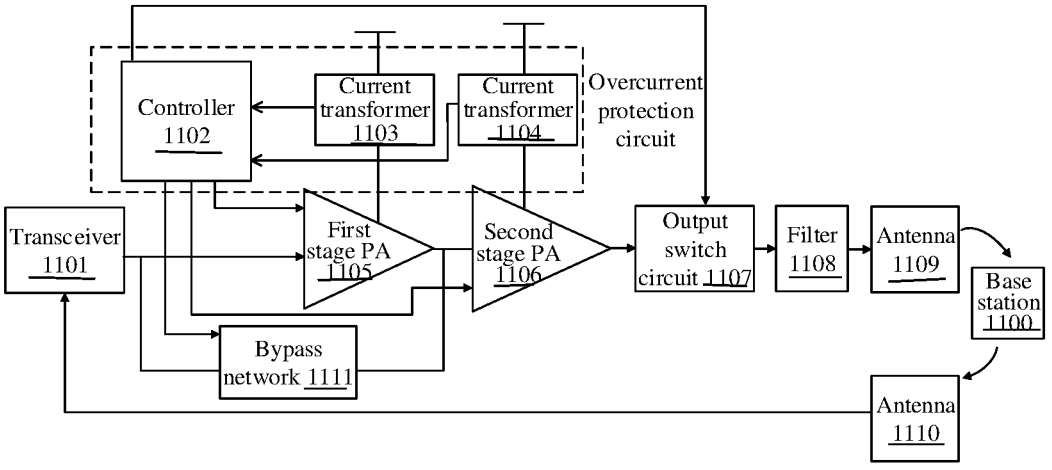
FIG. 11 is a schematic diagram of system compositional structures of an overcurrent protection circuit for a power amplifier according to an embodiment of the disclosure.

FIG. 11 is a schematic diagram of system compositional structures of an overcurrent protection circuit for a power amplifier according to an embodiment of the disclosure. As shown in FIG. 11, the system includes a base station 1100, a transceiver 1101, a controller 1102, a current transformer 1103, a current transformer 1104, a first stage PA 1105, a second stage PA 1106, an output switch circuit 1107, a filter 1108, an antenna 1109, an antenna 1110, and a bypass network 1111.

Here, the current transformer 1103 is arranged on a circuit connecting a collector of a power transistor of the first stage PA 1105 to a power supply voltage source, and the current transformer 1104 is arranged on a circuit connecting a collector of a power transistor of the second stage PA 1106 to a power supply voltage source. Output ends of the current transformer 1103 and the current transformer 1104 are connected to a first input end and a second input end of the controller 1102 respectively. A first output end of the controller 1102 is connected to a bias current control input end of the first stage PA 1105, a second output end of the controller 1102 is connected to a bias current control input end of the second stage PA 1106, a third output end of the controller 1102 is connected to a control input end of the output switch circuit 1107, and a fourth output end of the controller 1102 is connected to a control input end of the bypass network 1111. The antenna 1110 is connected to an input end of the transceiver 1101, an output end of the transceiver 1101 is connected to a power input end of the first stage PA 1105, a power output end of the first stage PA 1105 is connected to a power input end of the second stage PA 1106, an output end of the second stage PA 1106 is connected to a power input end of the output switch circuit 1107, an output end of the output switch circuit 1107 is connected to an input end of the filter 1108, and an output end of the filter 1108 is connected to the antenna 1109. Here, no line is connected between the base station 1100 and the antennas 1109 and 1110, however, the base station 1100 may receive a power signal fed back by the antenna 1109 and send control commands to the antenna 1110.

The current transformer 1103 is configured to sense a current on the collector of the power transistor of the first stage PA 1105 to obtain a first current signal. The current transformer 1104 is configured to sense a current on the collector of the power transistor of the second stage PA 1106 to obtain a second current signal. The controller 1102 is configured to generate a first current control signal, a second current control signal, a bypass network control signal and an output switch control signal based on the first current signal and the second current signal. The first current control signal is configured to control a bias current of the first stage PA 1105. The second current control signal is configured to control a bias current of the second stage PA 1106. The bypass network control signal is configured to increase or decrease characteristic parameters of the bypass network 1111. The output switch control signal is configured to control the output switch circuit 1107 to be turned on or off. The base station 1100 is configured to receive a power signal sent by the antenna 1109 and fed back by the power amplifier, and send generated control commands to the antenna 1110. The antenna 1110 is configured to receive the control commands sent by the base station 1100 and transmit the control commands to the transceiver 1101. The transceiver 1101 is configured to provide input power with corresponding power to the first stage PA 1105, in response to the control commands. The bypass network 1111 is configured to increase or decrease the characteristic parameters itself, in response to the bypass network control signal, so as to decrease or increase a power signal input to the first stage PA 1105. The first stage PA 1105 is configured to perform a first power amplification on an input power signal, in response to the first current control signal, and input a power signal after the first amplification to the second stage PA 1106. The second stage PA 1106 is configured to perform a second amplification on the power signal after the first amplification, in response to the second current control signal, and input a power signal after the second amplification to the output switch circuit 1107. The output switch circuit 1107 is configured to turn on or off connection between the second stage PA 1106 and the filter 1108. The filter 1108 is configured to implement switching of different frequency bands (communication modes). The antenna 1109 is configured to feed a power signal output by the filter 1108 back to the base station 1100. The antenna 1110 is configured to receive the control commands sent by the base station 1100 and send the control commands to the transceiver 1101.

Operation process includes the following operations. The current transformer 1103 detects an operation current of the first stage PA 1105, and the current transformer 1104 detects an operation current of the second stage PA 1106. When an excessive current occurs on PA, the overcurrent protection circuit provides the operation current of the first stage PA 1105 and the operation current of the second stage PA 1106 to the controller 1102, and the controller 1102 generates the first current control signal and the second current control signal configured to control bias currents of the first stage PA 1105 and the second stage PA 1106 respectively, the bypass network control signal configured to decrease or increase the characteristic parameters of the bypass network 1111, and the output switch control signal configured to turn off the output switch circuit 1107, based on the operation current of the first stage PA 1105 and the operation current of the second stage PA 1106. The first stage PA 1105 is offset to a lower DC operation point, or is directly turned off, in response to the first current control signal. The second stage PA 1106 is offset to a lower DC operation point, or is directly turned off, in response to the second current control signal. The bypass network 1111 decreases the characteristic parameters of the bypass network 1111, in response to the bypass network control signal. The output switch circuit 1107 turns off its path with the filter 1108, in response to the output switch control signal, thus achieving an effect of protecting PA.

It may be known from the above embodiments that in the embodiments of the disclosure, a bypass network is arranged between input and output ends of the first stage amplifier (multi-stage amplifier) of PA (the bypass network is connected in parallel with the first stage amplifier (multi-stage amplifier)), and the bypass network is set to be in a high insertion loss state when PA operates normally, and PA performs normal amplification. When overvoltage or overcurrent is enabled, the controller reduces the bias current of PA or turns off devices in the path of PA, while sets the bypass network to be in a low insertion loss state such that an input power signal input to the first stage amplifier (or multi-stage amplifier) connected in parallel with bypass adjustable attenuation is reduced, and adjusts the output switch circuit to be in a turn-off state. Due to closed-loop control of the input power signal, the base station may control input power transmitted by the transceiver to be increased continuously. After overvoltage or overcurrent is recovered, the controller first controls recovery of bias currents of power transistors in the RF path such that RF devices in the path recover normal operation, and controls the output switch circuit to be turned on. At this time, gains of one or more stage amplifiers in PA become lower due to a negative feedback effect of the bypass network. Even though the input signal reaches a maximum value of the transceiver, power input to a later stage amplifier is still small, which may not burn out the path of PA in an unstable state. After delaying a sufficiently long time, PA and other devices in the RF path reach their respective stable states (the output switch circuit is in a stable turn-on state), and the controller gradually adjusts the bypass network to a high insertion loss state at this point, such that the power amplifier operates normally. At this time, since a steady state of the RF path has been established, signals are amplified through a normal path, and PA may not be burned out.

Figure 12:
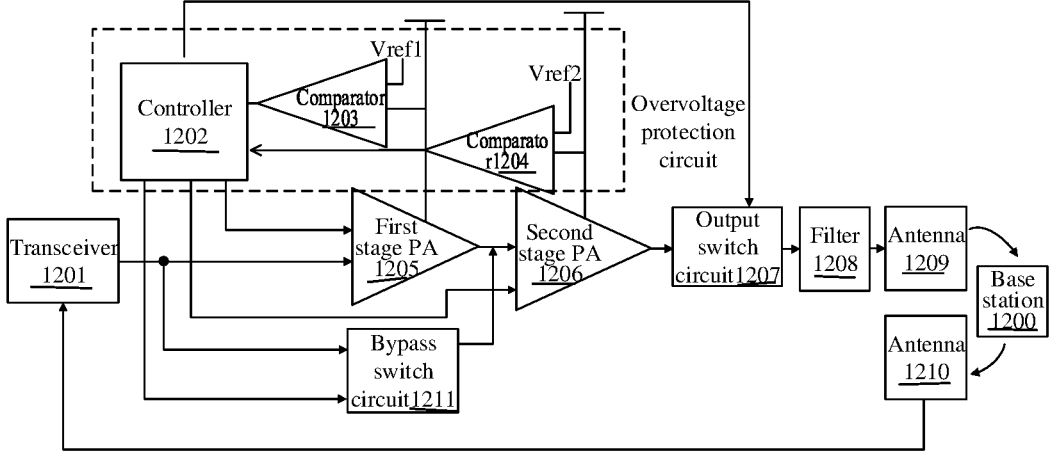
FIG. 12 is a schematic diagram of system compositional structures of another overvoltage protection circuit for a power amplifier according to an embodiment of the disclosure.

FIG. 12 is a schematic diagram of system compositional structures of another overvoltage protection circuit for a power amplifier according to an embodiment of the disclosure. As shown in FIG. 12, the system includes a base station 1200, a transceiver 1201, a controller 1202, a comparator 1203, a comparator 1204, a first stage PA 1205, a second stage PA 1206, an output switch circuit 1207, a filter 1208, an antenna 1209, an antenna 1210, and a bypass switch circuit 1211.

Here, a first input end of the comparator 1203 is connected to a reference voltage Vref1, a second input end of the comparator 1203 is connected to a collector of a power transistor of the first stage PA 1205, and an output end of the comparator 1203 is connected to a first input end of the controller 1202. A first input end of the comparator 1204 is connected to a reference voltage Vref2, a second input end of the comparator 1204 is connected to a collector of a power transistor of the second stage PA 1206, and an output end of the comparator 1204 is connected to a second input end of the controller 1202. A first output end of the controller 1202 is connected to a bias current control input end of the first stage PA 1205, a second output end of the controller 1202 is connected to a bias current control input end of the second stage PA 1206, a third output end of the controller 1202 is connected to a control input end of the output switch circuit 1207, and a fourth output end of the controller 1202 is connected to a control input end of the bypass switch circuit 1211. The antenna 1210 is connected to an input end of the transceiver 1201, an output end of the transceiver 1201 is connected to a power input end of the first stage PA 1205, an output end of the first stage PA 1205 is connected to a power input end of the second stage PA 1206, a first output end of the second stage PA 1206 is connected to a power input end of the output switch circuit 1207, an output end of the output switch circuit 1207 is connected to an input end of the filter 1208, and an output end of the filter 1208 is connected to the antenna 1209. The bypass switch circuit 1211 is bridged between the power input end of the first stage PA 1205 and a power output end of the first stage PA 1205. Here, no line is connected between the base station 1200 and the antennas 1209 and 1210, however, the base station 1200 may receive a power signal fed back by the antenna 1209 and send control commands to the antenna 1210.

The comparator 1203 is configured to compare the reference voltage Vref1 with a power supply voltage source of the power transistor of the first stage PA 1205 to obtain a first comparison signal. The comparator 1204 is configured to compare the reference voltage Vref2 with a power supply voltage source of the power transistor of the second stage PA 1206 to obtain a second comparison signal. The controller 1202 is configured to generate a first current control signal, a second current control signal, a bypass switch control signal and an output switch control signal based on the first comparison signal and the second comparison signal. The first current control signal is configured to control a bias current of the first stage PA 1205. The second current control signal is configured to control a bias current of the second stage PA 1206. The bypass switch control signal is configured to control the bypass switch circuit 1211 to be turned on or off. The output switch control signal is configured to control the output switch circuit 1207 to be turned on or off. The base station 1200 is configured to receive a feedback power signal sent by the antenna 1209 and send generated control commands to the antenna 1210. The antenna 1210 is configured to receive the control commands sent by the base station 1200 and transmit the control commands to the transceiver 1201. The transceiver 1201 is configured to provide an input power signal with corresponding power to the first stage PA 1205, in response to the control commands. The bypass switch circuit 1211 is configured to perform short-circuit on or connect to the first stage PA 1205, in response to the bypass switch control signal. The first stage PA 1205 is configured to perform a first power amplification on the input power signal, in response to the first current control signal, and input a power signal after the first amplification to the second stage PA 1206. The second stage PA 1206 is configured to perform a second amplification on the power signal after the first amplification, in response to the second current control signal, and input a power signal after the second amplification to the output switch circuit 1207. The output switch circuit 1207 is configured to turn on or off connection between the second stage PA 1206 and the filter 1208. The filter 1208 is configured to implement switching of different frequency bands (communication modes). The antenna 1209 is configured to feed a power signal output by the filter 1208 back to the base station 1200. The antenna 1210 is configured to receive the control commands sent by the base station 1200 and send the control commands to the transceiver 1201.

Operation process includes the following operations. The overvoltage protection circuit compares the power supply voltage source of the power transistor of the first stage PA 1205 with the reference voltage Vref1 to obtain the first comparison signal, and compares the power supply voltage source of the power transistor of the second stage PA 1206 with the reference voltage Vref2 to obtain the second comparison signal. When an excessive voltage occurs on PA, the overvoltage protection circuit provides the first comparison signal and the second comparison signal to the controller 1202, and the controller 1202 generates the first current control signal and the second current control signal configured to control bias currents of the first stage PA 1205 and the second stage PA 1206 respectively, the bypass switch control signal configured to turn on the bypass switch circuit 1211, and the output switch control signal configured to turn off the output switch circuit 1207, based on the first comparison signal and the second comparison signal. The first stage PA 1205 is offset to a lower DC operation point, or is directly turned off, in response to the first current control signal. The second stage PA 1206 is offset to a lower DC operation point, or is directly turned off, in response to the second current control signal. The bypass switch circuit 1211 performs short-circuit on the first stage PA 1205, in response to the bypass switch control signal. The output switch circuit 1207 turns off its path with the filter 1208, in response to the output switch control signal, thus achieving an effect of protecting PA.

Figure 13:
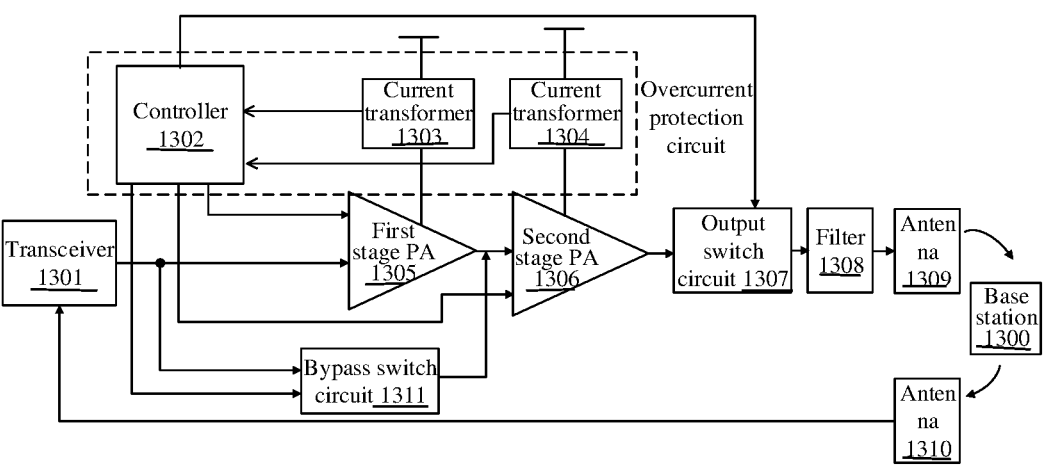
FIG. 13 is a schematic diagram of system compositional structures of another overcurrent protection circuit for a power amplifier according to an embodiment of the disclosure.

FIG. 13 is a schematic diagram of system compositional structures of another overcurrent protection circuit for a power amplifier according to an embodiment of the disclosure. As shown in FIG. 13, the system includes a base station 1300, a transceiver 1301, a controller 1302, a current transformer 1303, a current transformer 1304, a first stage PA

1305, a second stage PA 1306, an output switch circuit 1307, a filter 1308, an antenna 1309, an antenna 1310, and a bypass switch circuit 1311.

Here, the current transformer 1303 is arranged on a circuit connecting a collector of a power transistor of the first stage PA 1305 to a power supply voltage source, and the current transformer 1304 is arranged on a circuit connecting a collector of a power transistor of the second stage PA 1306 to a power supply voltage source. Output ends of the current transformer 1303 and the current transformer 1304 are connected to a first input end and a second input end of the controller 1302 respectively. A first output end of the controller 1302 is connected to a bias current control input end of the first stage PA 1305, a second output end of the controller 1302 is connected to a bias current control input end of the second stage PA 1306, a third output end of the controller 1302 is connected to a control input end of the output switch circuit 1307, and a fourth output end of the controller 1302 is connected to a control input end of the bypass switch circuit 1311. The antenna 1310 is connected to an input end of the transceiver 1301, an output end of the transceiver 1301 is connected to a power input end of the first stage PA 1305, a power output end of the first stage PA 1305 is connected to a power input end of the second stage PA 1306, an output end of the second stage PA 1306 is connected to a power input end of the output switch circuit 1307, an output end of the output switch circuit 1307 is connected to an input end of the filter 1308, and an output end of the filter 1308 is connected to the antenna 1309. Here, no line is connected between the base station 1300 and the antennas 1309 and 1310, however, the base station 1300 may receive a power signal fed back by the antenna 1309 and send control commands to the antenna 1310.

The current transformer 1303 is configured to sense a current on the collector of the power transistor of the first stage PA 1305 to obtain a first current signal. The current transformer 1304 is configured to sense a current on the collector of the power transistor of the second stage PA 1306 to obtain a second current signal. The controller 1302 is configured to generate a first current control signal, a second current control signal, a bypass switch control signal and an output switch control signal based on the first current signal and the second current signal. The first current control signal is configured to control a bias current of the first stage PA 1305. The second current control signal is configured to control a bias current of the second stage PA 1306. The bypass switch control signal is configured to control the bypass switch circuit 1311 to be turned on or off. The output switch control signal is configured to control the output switch circuit 1307 to be turned on or off. The base station 1300 is configured to receive a power signal sent by the antenna 1309 and fed back by the power amplifier, and send generated control commands to the antenna 1310. The antenna 1310 is configured to receive the control commands sent by the base station 1300 and transmit the control commands to the transceiver 1301. The transceiver 1301 is configured to provide input power with corresponding power to the first stage PA 1305, in response to the control commands. The bypass switch circuit 1311 performs short-circuit on the first stage PA 1305 or connects the first stage PA 1305 to the second stage PA 1306, in response to the bypass switch control signal. The first stage PA 1305 is configured to perform a first power amplification on an input power signal, in response to the first current control signal, and input a power signal after the first amplification to the second stage PA 1306. The second stage PA 1306 is configured to perform a second amplification on the power signal after the first amplification, in response to the second current control signal, and input a power signal after the second amplification to the output switch circuit 1307. The output switch circuit 1307 is configured to turn on or off connection between the second stage PA 1306 and the filter 1308. The filter 1308 is configured to implement switching of different frequency bands (communication modes). The antenna 1309 is configured to feed a power signal output by the filter 1308 back to the base station 1300. The antenna 1310 is configured to receive the control commands sent by the base station 1300 and send the control commands to the transceiver 1301.

Operation process includes the following operations. The current transformer 1303 detects an operation current of the first stage PA 1305, and the current transformer 1304 detects an operation current of the second stage PA 1306. When an excessive current occurs on PA, the overcurrent protection circuit provides the operation current of the first stage PA 1305 and the operation current of the second stage PA 1306 to the controller 1302, and the controller 1302 generates the first current control signal and the second current control signal configured to control bias currents of the first stage PA 1305 and the second stage PA 1306 respectively, the bypass switch control signal configured to turn on the bypass switch circuit 1311, and the output switch control signal configured to turn off the output switch circuit 1307, based on the operation current of the first stage PA 1305 and the operation current of the second stage PA 1306. The first stage PA 1305 is offset to a lower DC operation point, or is directly turned off, in response to the first current control signal. The second stage PA 1306 is offset to a lower DC operation point, or is directly turned off, in response to the second current control signal. The bypass switch circuit 1311 performs short-circuit on the first stage PA 1305, in response to the bypass switch control signal. The output switch circuit 1307 turns off its path with the filter 1308, in response to the output switch control signal, thus achieving an effect of protecting PA.

It may be known from the above embodiments that in the embodiments of the disclosure, a bypass switch circuit is arranged between input and output ends of the first stage amplifier (multi-stage amplifier) of PA (the bypass switch circuit is connected in parallel with the first stage amplifier (multi-stage amplifier)), and the bypass switch circuit is set to be in a turn-off state when PA operates normally, and PA performs normal amplification. When overvoltage or over-current is enabled, the controller reduces the bias current of PA or turns off devices in the path of PA, while adjusts the bypass switch circuit to be in a turn-on state such that short-circuit occurs on the first stage amplifier (or multi-stage amplifier) connected in parallel with the bypass switch circuit, and adjusts the output switch circuit to be in a turn-off state. Due to closed-loop control of the input power signal, the base station may control input power transmitted by the transceiver to be increased continuously. When the input power reaches a maximum power value of the transceiver, since the input power is not amplified by the multi-stage amplifier, power still has a small value, which may not burn out PA in an unstable state. After overvoltage or overcurrent is recovered, the controller first controls recovery of bias currents of power transistors in the RF path such that RF devices in the path recover normal operation, and controls the output switch circuit to be turned on. After delaying a sufficiently long time, PA and other devices in the RF path reach their respective stable states (the output switch circuit is in a stable turn-on state), and the controller turns off the bypass switch circuit at this point, such that the power amplifier operates normally. At this time, since a steady state of the RF path has been established, signals are amplified through a normal path, and PA may not be burned out.

The above descriptions of the embodiments tend to emphasize differences between the embodiments, and the same or similarities thereof may refer to each other, which may not be elaborated here for simplicity.

Methods disclosed in the method embodiments provided in the disclosure may be combined arbitrarily without conflict, to obtain new method embodiments.

Features disclosed in the product embodiments provided in the disclosure may be combined arbitrarily without conflict, to obtain new product embodiments.

Features disclosed in the method or phase shifter embodiments provided in the disclosure may be combined arbitrarily without conflict, to obtain new method or device embodiments.

The embodiments of the disclosure are described as above with reference to the drawings, however, the disclosure is not limited to the above embodiments. The above embodiments are only exemplary, rather than restrictive. Under inspiration of the disclosure, those of ordinary skill in the art may also make many forms without departing from the purpose of the disclosure and the scope of protection of the claims, all of which fall within the protection of the disclosure.

The invention claimed is:

1. A circuit for protecting an amplifier, comprising: a detection circuit, a controller and a bypass impedance adjustment circuit, the detection circuit provided with an input end connected to a power amplifier and an output end connected to an input end of the controller, and configured to detect an operation electrical signal of the power amplifier and generate a trigger electrical signal based on the operation electrical signal correspondingly, a first output end of the controller connected to a base or a gate or a bias circuit of the power amplifier, and a second output end of the controller connected to a control input end of the bypass impedance adjustment circuit, the bypass impedance adjustment circuit connected in parallel with the power amplifier, the controller configured to generate a first control signal and a second control signal based on the trigger electrical signal, the first control signal configured to control a bias current or bias voltage of the power amplifier to reduce or recover a gain of the power amplifier, and the second control signal configured to control characteristic parameters of the bypass impedance adjustment circuit, and the bypass impedance adjustment circuit configured to bypass the power amplifier connected in parallel therewith correspondingly, in response to the second control signal.

2. The circuit of claim 1, wherein the power amplifier is a multi-stage amplifier, and the bypass impedance adjustment circuit bypasses at least one stage amplifier of the power amplifier.

3. The circuit of claim 2, wherein an output end of the bypass impedance adjustment circuit is connected to an input end of a final stage amplifier of the power amplifier.

4. The circuit of claim 1, wherein the bypass impedance adjustment circuit is further configured to attenuate an input signal.

5. The circuit of claim 1, wherein the second control signal increases input power of the power amplifier, after a preset time elapses from the first control signal recovering the gain of the power amplifier.

6. The circuit of claim 5, wherein the preset time is a time required for the power amplifier to be stable.

7. The circuit of claim 1, wherein the bypass impedance adjustment circuit comprises a bypass switch circuit, and the characteristic parameters of the bypass impedance adjustment circuit comprise an impedance of the bypass switch circuit, the second output end of the controller is connected to a control input end of the bypass switch circuit, the bypass switch circuit is connected in parallel with the power amplifier, and the second control signal is configured to adjust the impedance of the bypass switch circuit, the bypass switch circuit is configured to adjust the impedance itself in response to the second control signal, to perform short-circuit on or connect to the power amplifier connected in parallel therewith correspondingly, and reduce or recover the gain of the power amplifier.

8. The circuit of claim 1, wherein the bypass impedance adjustment circuit comprises a bypass network, and the characteristic parameters of the bypass impedance adjustment circuit comprise at least one of an impedance or insertion loss of the bypass network, the second output end of the controller is connected to a control input end of the bypass network, the bypass network is connected in parallel with the power amplifier, and the second control signal is configured to adjust at least the impedance or the insertion loss of the bypass network, the bypass network is configured to adjust at least the impedance or the insertion loss itself in response to the second control signal, to reduce or recover the gain of the power amplifier.

9. The circuit of claim 1, wherein the power amplifier comprises first to N-th stage amplifiers, the detection circuit comprises first to N-th voltage detection circuits, and the first to N-th trigger electrical signals comprise first to N-th trigger voltage signals, a k-th voltage detection circuit is provided with a first input end configured to obtain a reference voltage, a second input end connected to a feed end of a k-th stage amplifier and an output end connected to a k-th port in a first input end of the controller, and k represents any positive integer from 1 to N, the k-th voltage detection circuit is configured to detect an operation voltage signal of the k-th stage amplifier and generate a k-th trigger voltage signal based on the operation voltage signal of the k-th stage amplifier, the controller is configured to generate the first control signal and the second control signal based on the first to N-th trigger voltage signals.

10. The circuit of claim 1, wherein the power amplifier comprises first to N-th stage amplifiers, the detection circuit comprises first to N-th current detection circuits, and the first to N-th trigger electrical signals comprise first to N-th trigger current signals, a k-th current detection circuit is provided with an input end connected to a feed end of a k-th stage amplifier and a detection output end connected to a k-th port in a second input end of the controller, and k represents any positive integer from 1 to N, the k-th current detection circuit is configured to detect an operation current signal of the k-th stage amplifier and generate a k-th trigger current signal based on the operation current signal of the k-th stage amplifier, the controller is configured to generate the first control signal and the second control signal based on the first to N-th trigger current signals.

11. The circuit of claim 1, wherein the power amplifier comprises a first stage amplifier and a second stage amplifier, and the bypass impedance adjustment circuit is bridged between an input end of the first stage amplifier and an output end of the first stage amplifier.

12. A method for protecting an amplifier, comprising:

detecting, by a detection circuit, an operation electrical signal of a power amplifier, and generating a trigger electrical signal based on the operation electrical signal correspondingly;

generating, by a controller, a first control signal and a second control signal based on the trigger electrical signal, the first control signal configured to control a bias current or bias voltage of the power amplifier to reduce or recover a gain of the power amplifier, and the second control signal configured to control characteristic parameters of a bypass impedance adjustment circuit; and bypassing, by the bypass impedance adjustment circuit, the power amplifier connected in parallel therewith correspondingly, in response to the second control signal.

13. The method of claim 12, wherein the power amplifier comprises first to N-th stage amplifiers, operation electrical signals of the first to N-th stage amplifiers comprise operation voltage signals of the first to N-th stage amplifiers, and the first to N-th trigger electrical signals comprise first to N-th trigger voltage signals, detecting, by the detection circuit, the operation electrical signal of the power amplifier, and generating the trigger electrical signal based on the operation electrical signal correspondingly comprises:

obtaining, by the detection circuit, the operation voltage signals of the first to N-th stage amplifiers, and generating the first to N-th trigger voltage signals based on the operation voltage signals of the first to N-th stage amplifiers and corresponding reference voltages, the first control signal comprises first to N-th sub-signals configured to reduce or cut off bias currents or bias voltages of the first to N-th stage amplifiers respectively, and the second control signal comprises a (N+1)-th sub-signal configured to decrease the characteristic parameters of the bypass impedance adjustment circuit, generating, by the controller, the first control signal and the second control signal based on the trigger electrical signal comprises:

determining, by the controller, whether each stage amplifier of the first to N-th stage amplifiers is in an overvoltage state according to the first to N-th trigger voltage signals; and generating a h-th sub-signal and the (N+1)-th sub-signal in response to determining that a h-th stage amplifier of the first to N-th stage amplifiers is in the overvoltage state, h being a positive integer between 1 and N, reducing or recovering, by the bypass impedance adjustment circuit, the gain of the power amplifier in response to the second control signal comprises:

reducing, by the bypass impedance adjustment circuit, the gain of the power amplifier in response to the (N+1)-th sub-signal, to implement protection of the power amplifier.

14. The method of claim 13, wherein the first control signal further comprises (N+2)-th to (2N+1)-th sub-signals configured to recover the bias currents or bias voltages of the first to N-th stage amplifiers, and the second control signal further comprises a (2N+2)-th sub-signal configured to increase the characteristic parameters of the bypass impedance adjustment circuit, generating, by the controller, the first control signal and the second control signal based on the trigger electrical signal comprises:

determining, by the controller, whether each stage amplifier of the first to N-th stage amplifiers is in a normal voltage state according to the first to N-th trigger voltage signals; and generating the (N+2)-th to (2N+1)-th sub-signals in response to determining that each stage amplifier of the first to N-th stage amplifiers is in the normal voltage state, and delaying a preset time to generate the (2N+2)-th sub-signal, reducing or recovering, by the bypass impedance adjustment circuit, the gain of the power amplifier in response to the second control signal comprises:

recovering, by the bypass impedance adjustment circuit, the gain of the power amplifier in response to the (2N+2)-th sub-signal, to recover operation of the power amplifier.

15. The method of claim 14, wherein the operation electrical signals of the first to N-th stage amplifiers comprise operation current signals of the first to N-th stage amplifiers, and the first to N-th trigger electrical signals comprise first to N-th trigger current signals, detecting, by the detection circuit, the operation electrical signal of the power amplifier, and generating the trigger electrical signal based on the operation electrical signal correspondingly comprises:

obtaining, by the detection circuit, the operation current signals of the first to N-th stage amplifiers, and determining the operation current signals of the first to N-th stage amplifiers as the first to N-th trigger current signals, generating, by the controller, the first control signal and the second control signal based on the trigger electrical signal comprises:

determining, by the controller, whether each stage amplifier of the first to N-th stage amplifiers is in an overcurrent state according to the first to N-th trigger current signals; and generating the h-th sub-signal and the (N+1)-th sub-signal in response to determining that a h-th stage amplifier of the first to N-th stage amplifiers is in the overcurrent state, h being a positive integer between 1 and N.

16. The method of claim 15, wherein generating, by the controller, the first control signal and the second control signal based on the trigger electrical signal comprises:

determining, by the controller, whether each stage amplifier of the first to N-th stage amplifiers is in a normal current state according to the first to N-th trigger current signals; and generating the (N+2)-th to (2N+1)-th sub-signals in response to determining that each stage amplifier of the first to N-th stage amplifiers is in the normal current state, and delaying a preset time to generate the (2N+2)-th sub-signal.

17. The method of claim 12, wherein the bypass impedance adjustment circuit comprises a bypass switch circuit, and the characteristic parameters of the bypass impedance adjustment circuit comprise an impedance of the bypass switch circuit, or, the bypass impedance adjustment circuit comprises a bypass network, and the characteristic parameters of the bypass impedance adjustment circuit comprise at least an impedance or insertion loss of the bypass network.

* * * * *